(12) United States Patent
Kang et al.

(10) Patent No.: US 7,968,870 B2
(45) Date of Patent: Jun. 28, 2011

(54) THIN FILM TRANSISTOR, ORGANIC LIGHT EMITTING DISPLAY DEVICE INCLUDING THE SAME, AND METHOD OF MANUFACTURING THE ORGANIC LIGHT EMITTING DISPLAY DEVICE

(75) Inventors: Chul-Kyu Kang, Suwon-si (KR);
Jong-Hyun Choi, Suwon-si (KR);
Woo-Sik Jun, Suwon-si (KR);
Hee-Chul Jeon, Suwon-si (KR)

(73) Assignee: Samsung Mobile Display Co., Ltd.,
Suwon-si, Gyeonggi-do (KR)

( * ) Notice: Subject to any disclaimer, the term of this patent is extended or adjusted under 35 U.S.C. 154(b) by 219 days.

(21) Appl. No.: 12/076,048

(22) Filed: Mar. 13, 2008

(65) Prior Publication Data
US 2008/0246029 A1 Oct. 9, 2008

(30) Foreign Application Priority Data
Apr. 9, 2007 (KR) .................. 10-2007-0034617

(51) Int. Cl.
*H01L 51/52* (2006.01)
(52) U.S. Cl. ............... 257/40; 257/59; 257/72; 257/30; 438/82
(58) Field of Classification Search ............ 257/13, 257/79–103, 918, E51.018–E51.022, E33.001–E33.077, 257/E33.054, E25.028, E25.032, 59, 72; 438/22–47, 69, 493, 503, 507, 956, 30
See application file for complete search history.

(56) References Cited

U.S. PATENT DOCUMENTS

| | | | |
|---|---|---|---|
| 6,067,062 A * | 5/2000 | Takasu et al. | 345/87 |
| 2002/0139978 A1* | 10/2002 | Yamazaki et al. | 257/69 |
| 2003/0067007 A1* | 4/2003 | Morosawa | 257/72 |
| 2004/0125265 A1* | 7/2004 | Koo et al. | 349/56 |
| 2005/0110021 A1* | 5/2005 | Park et al. | 257/72 |
| 2007/0045556 A1* | 3/2007 | Watanabe et al. | 250/370.14 |
| 2007/0187761 A1* | 8/2007 | Hamada et al. | 257/351 |
| 2007/0267648 A1* | 11/2007 | Hwang et al. | 257/99 |
| 2008/0277666 A1* | 11/2008 | Jeon et al. | 257/66 |

FOREIGN PATENT DOCUMENTS
JP 07-130652 * 5/1995

* cited by examiner

*Primary Examiner* — Wai Sing Louie
*Assistant Examiner* — Sue Tang
(74) *Attorney, Agent, or Firm* — Lee & Morse, P.C.

(57) ABSTRACT

A thin film transistor, e.g., for use in an organic light emitting display, may include: a gate insulating layer disposed on a gate electrode located on a substrate; a semiconductor layer, disposed on the gate insulating layer; and a planarization layer disposed on the gate insulating layer, the source and drain electrodes, and the channel area, and having openings exposing parts of the first source and drain areas and the source and drain electrodes, respectively. The semiconductor layer may include: a channel area corresponding to the gate electrode; first source and drain areas doped with an impurity outside the channel area; second source and drain areas, including a metal, outside the first source and drain areas; and source and drain electrodes disposed on the second source and drain areas and exposing the first source and drain areas. A pixel electrode may be disposed in one of the openings.

17 Claims, 9 Drawing Sheets

THIN FILM TRANSISTOR, ORGANIC LIGHT EMITTING DISPLAY DEVICE INCLUDING THE SAME, AND METHOD OF MANUFACTURING THE ORGANIC LIGHT EMITTING DISPLAY DEVICE

BACKGROUND OF THE INVENTION

1. Field of the Invention

Embodiments of the present invention relate to a thin film transistor, an organic light emitting display device including the same, and a method of manufacturing the organic light emitting display device. More particularly, embodiments of the present invention relate to a bottom gate-type thin film transistor having a low contact resistance, an organic light emitting display device including the same, and a method of manufacturing the organic light emitting display device.

2. Description of the Related Art

Thin film transistors (TFTs) may be used, among other things, as switching devices or driving devices. A conventional TFT may include a gate electrode, a semiconductor layer, and source/drain electrodes. Such TFTs may be classified into top gate type TFTs and bottom gate type TFTs according to a location of the gate electrode with respect to the semiconductor layer.

Typically, top gate type TFTs are used in display devices, e.g., liquid crystal display (LCD) devices, organic light emitting display devices, and so forth. A conventional organic light emitting display device may refer to a device that includes a light emitting layer between two electrodes, a pixel electrode and an opposite electrode, one of the electrodes being connected to a TFT. Such a device may have a wide viewing angle, excellent contrast, and rapid response.

The conventional method of manufacturing an organic light emitting display device includes many mask patterning processes, e.g., at least eight mask patterning steps to reach a point of having formed a pixel defining layer on the pixel electrode. Additional mask patterning steps are needed to form an organic emission layer on the pixel defining layer, and to form the opposite electrode on the organic emission layer. Since each mask patterning process includes coating, exposing, and developing steps using photoresist, the method of manufacturing a conventional organic light emitting display device is made more complex and expensive with each additional mask patterning process.

SUMMARY OF THE INVENTION

Embodiments of the present invention are therefore directed to a thin film transistor, an organic light emitting display device including the same, and a method of manufacturing the organic light emitting display device which substantially overcome one or more problems of the related art.

It is therefore a feature of an embodiment of the present invention to provide a thin film transistor that can be fabricated using a simplified manufacturing method in which the number of mask patterning processes may be reduced, an organic light emitting display device including the same, and a method of manufacturing the organic light emitting display device.

At least one of the above and other features and advantages of the present invention may be realized by providing a thin film transistor including a substrate, a gate electrode disposed on the substrate, a gate insulating layer disposed on the gate electrode and the substrate, a semiconductor layer disposed on the gate insulating layer and including at least the following, a channel area corresponding to the gate electrode, first source and drain areas doped with an impurity outside the channel area, second source and drain areas, including a metal, outside the first source and drain areas, and source and drain electrodes disposed on the second source and drain areas and exposing the first source and drain areas, a planarization layer disposed on the gate insulating layer, the source and drain electrodes, and the channel area, and having openings exposing parts of the first source and drain areas and the source and drain electrodes, respectively, and a pixel electrode disposed on the planarization layer and electrically connected to one of the source and drain electrodes through one of the openings. The metal included in the second source and drain areas may include a metal forming the source and drain electrodes. The metal forming the source and drain electrodes may include at least one of Al, Cu, Mo, W, Cr, and Pt. End parts of the semiconductor layer may have the same pattern as end parts of the source and drain electrodes, respectively. The semiconductor layer may include polycrystalline silicon. The thin film transistor may further include a buffer layer disposed on the substrate.

At least one of the above and other features and advantages of the present invention also may be realized by providing an organic light emitting display device that includes a substrate, a gate electrode disposed on the substrate, a gate insulating layer disposed on the gate electrode and the substrate, a semiconductor layer, disposed on the gate insulating layer, including at least the following, a channel area corresponding to the gate electrode, first source and drain areas doped with an impurity outside the channel area, second source and drain areas, including a metal, outside the first source and drain areas, and source and drain electrodes disposed on the second source and drain areas and exposing the first source and drain areas, a planarization layer disposed on the gate insulating layer, the source and drain electrodes, and the channel area, and having openings exposing parts of the first source and drain areas and the source and drain electrodes, respectively, a pixel electrode disposed on the planarization layer and electrically connected to one of the source and drain electrodes through one of the openings, a pixel defining layer disposed on the planarization layer and the pixel electrode and exposing a part of the pixel electrode, an organic emission layer disposed on the exposed pixel electrode, and an opposite electrode disposed on the organic emission layer. The organic light emitting display device may further include a spacer disposed on the pixel defining layer. The pixel defining layer and the spacer may be formed of the same material. End parts of the semiconductor layer may have the same pattern as end parts of the source and drain electrodes, respectively.

At least one of the above and other features and advantages of the present invention also may be realized by providing a method of manufacturing a thin film transistor, the method including providing a starting structure including a substrate and a gate electrode disposed thereon, a gate insulating layer disposed on the gate electrode and the substrate, a semiconductor layer disposed on the gate insulating layer, and a conductive layer including a metal disposed on the semiconductor layer, simultaneously patterning the semiconductor layer and the conductive layer to expose a first part of the semiconductor layer including a portion thereof corresponding to the gate electrode and to form the source and drain electrodes, forming a planarization layer on the gate insulating layer, the source and drain electrodes, and the first part of the semiconductor layer, forming openings in the planarization layer to expose second parts of the semiconductor layer outside the first part thereof, doping the exposed second parts of semiconductor layer with an impurity, and dispersing the metal of the source and drain electrodes into the semiconductor layer by heat treating the source and drain electrodes.

When forming openings in the planarization layer to expose the second parts of the semiconductor layer, end parts of the semiconductor layer and an end part of each of the source and drain electrodes, respectively, may be patterned to have the same pattern. In the dispersing of the metal into the semiconductor layer, a temperature of the heat treating may be equal to or higher than a melting point of the conductive layer. The method may further include forming a pixel electrode on the planarization layer and on one of the source and drain electrodes in one of the openings, forming a pixel defining layer on the pixel electrode, patterning the pixel defining layer to expose a part of the pixel electrode, and forming an organic emission layer and an opposite electrode on the pixel defining layer. The method may further include forming a spacer on the pixel defining layer. The pixel defining layer and the spacer may be simultaneously patterned using a half-tone mask. The pixel defining layer and the spacer may be formed of the same material. The method may further include forming a buffer layer on the substrate. Forming the semiconductor layer may include depositing an amorphous silicon layer on the gate electrode and on the gate insulating layer, and crystallizing the amorphous silicon layer to form a polycrystalline silicon layer as the semiconductor layer. Simultaneously patterning the semiconductor layer and the conductive layer may include using a half-tone mask.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF THE INVENTION

Figure 1:
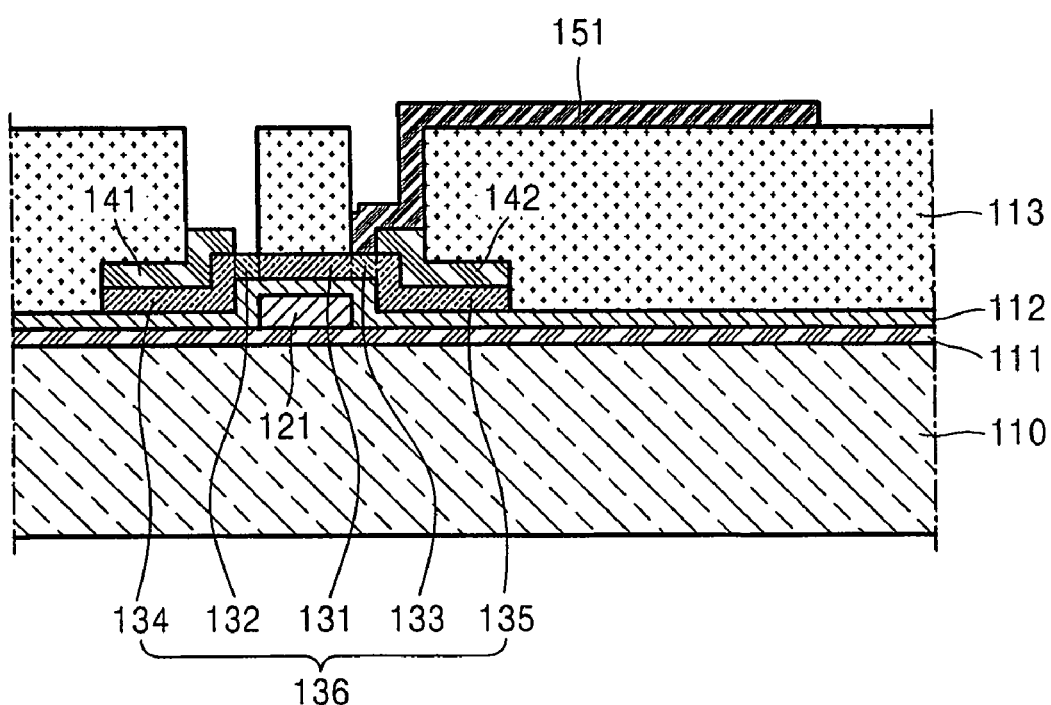
FIG. 1 illustrates a schematic, cross-sectional view of an organic light emitting display device according to an exemplary embodiment of the present invention.
Figure 2:
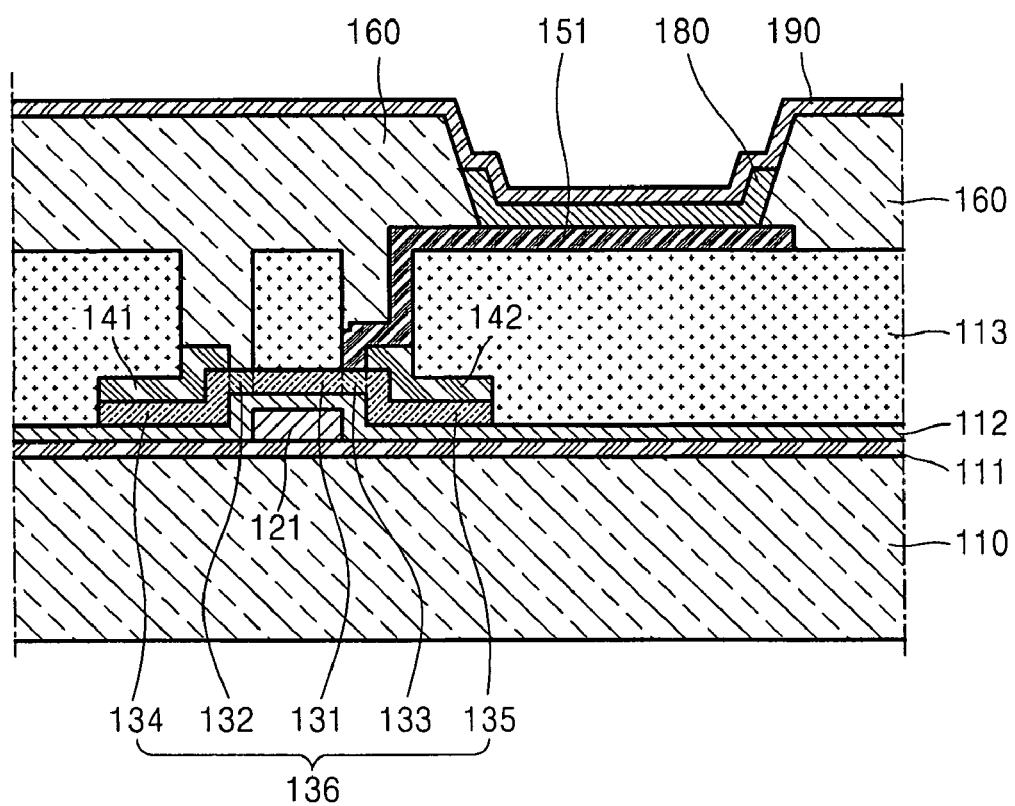
FIG. 2 illustrates a schematic, cross-sectional view of an organic light emitting display device according to another exemplary embodiment of the present invention.

Korean Patent Application No. 10-2007-0034617, filed on Apr. 9, 2007, in the Korean Intellectual Property Office, and entitled: "Thin Film Transistor, Organic Light Emitting Display Device Including the Same, and Method of Manufacturing the Organic Light Emitting Display Device," is incorporated by reference herein in its entirety.

Embodiments of the present invention will now be described more fully with reference to the accompanying drawings, in which exemplary embodiments of the invention are illustrated. Aspects of the invention may, however, be embodied in different forms and should not be construed as limited to the exemplary embodiments set forth herein. Rather, these exemplary embodiments are provided so that this disclosure will be thorough and complete, and will fully convey the scope of the invention to those skilled in the art.

In the figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Referring to FIG. 1, a thin film transistor (TFT) according to an exemplary embodiment of the present invention may include a substrate 110, a buffer layer 111, a gate electrode 121, a gate insulating layer 112, a semiconductor layer 136, source and drain electrodes 141 and 142, a planarization layer 113, and a pixel electrode 151.

The substrate 110 may be any suitable substrate. For example, the substrate 110 may be formed of glass, e.g., silicon dioxide ($SiO_2$), or other materials, e.g., plastic, and so forth.

The buffer layer 111 may be formed on the substrate 110 to planarize the substrate 110 and to reduce or prevent permeation of impurities into the substrate 110. The buffer layer 111 may be formed of one or more of $SiO_2$ and/or silicon nitride ($SiN_x$) by, e.g., plasma enhanced chemical vapor deposition (PECVD), atmospheric pressure chemical vapor deposition (APCVD), low pressure chemical vapor deposition (LPCVD), and so forth. The gate electrode 121, gate insulating layer 112, semiconductor layer 136, and source and drain electrodes 141 and 142 may be formed sequentially on the buffer layer 111, as will be explained in more detail below with reference to FIGS. 4-11.

Figure 4:
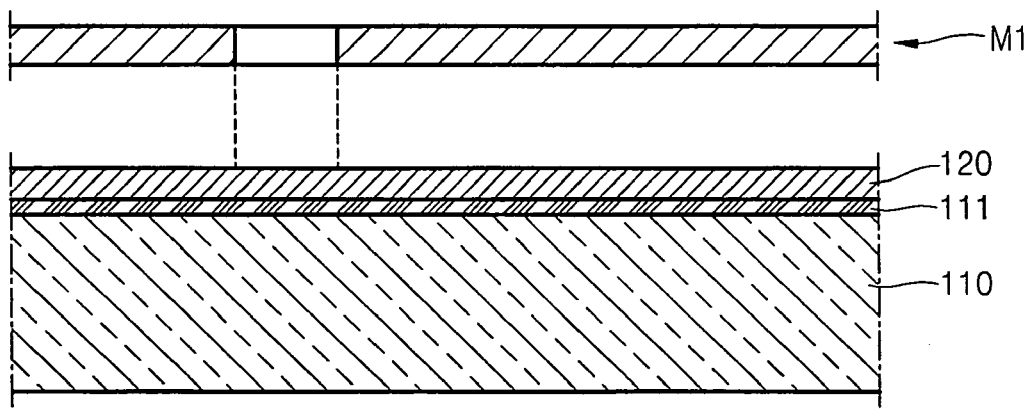
FIGS. 4-11 illustrate schematic, cross-sectional views of the organic light emitting display device of FIG. 1 during sequential stages in a method of manufacturing thereof according to an exemplary embodiment of the present invention.
Figure 5:
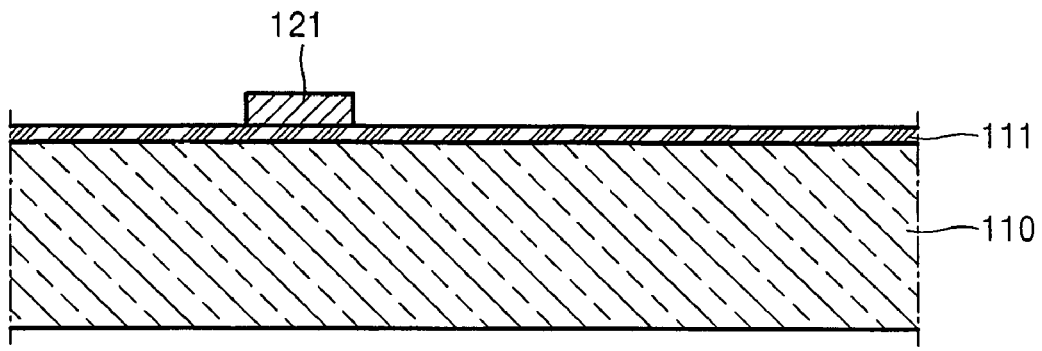

Referring to FIG. 4, a metal layer 120 may be formed on the buffer layer 111 of a low-resistance metal, e.g., molybdenum tungsten (MoW), aluminum copper (Al/Cu), and so forth. A mask M1 may be positioned above the metal layer 120 to facilitate patterning thereof, e.g., via photolithography, in order to form the gate electrode 121, as illustrated in FIG. 5. More specifically, the metal layer 120 may be formed, e.g., deposited, on the buffer layer 111, and a photoresist layer (not shown) may be coated on an upper surface of the metal layer 120. The photoresist layer may be baked, exposed using the mask M1, and developed. The metal layer 120 may then be patterned via etching, e.g., wet etching and/or dry etching, to form the gate electrode 121. If dry etching is used, plasma etching, reactive ion etching (RIE), reactive sputter etching, and/or reactive ion beam milling may be used. Once the gate electrode 121 is formed, it may be connected to a gate line (not shown) that may apply an on/off signal thereto in order to facilitate control of the TFT.

Figure 6:
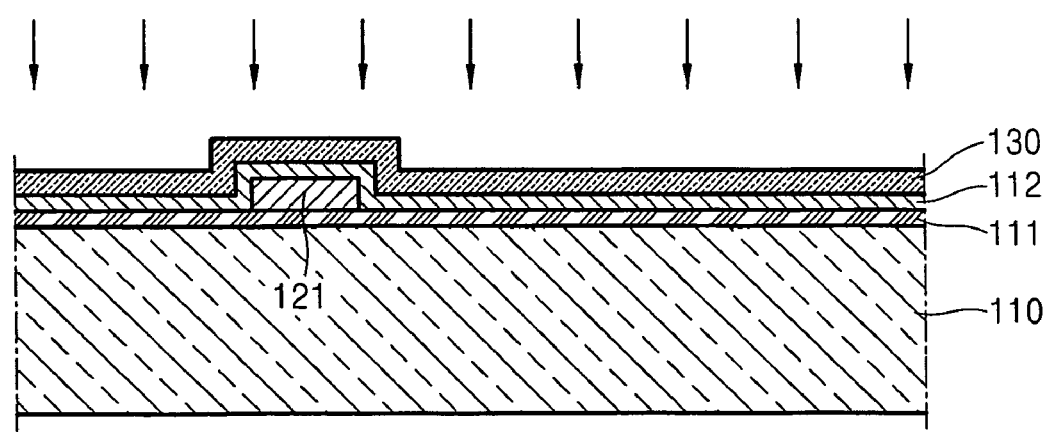

Referring to FIG. 6, the gate insulating layer 112 may be formed on the gate electrode 121 and the buffer layer 111. The gate insulating layer 112 may be formed of an inorganic insulating material, e.g., $SiN_x$ and/or $SiO_x$, by PECVD, APCVD, LPCVD, electron cyclotron resonance (ECR) CVD, or the like. Next, a patterned semiconductor layer 136 may be formed on the gate insulating layer 112. More specifically, an amorphous silicon layer 130 may be formed, e.g., deposited, on the gate insulating layer 112, and may be crystallized by, e.g., rapid thermal annealing (RTA), solid phase crystallization (SPC), excimer laser annealing (ELA), metal induced crystallization (MIC), metal induced lateral crystallization (MILC), sequential lateral solidification (SLS), and so forth, to form a polycrystalline silicon layer 130'.

Figure 7:
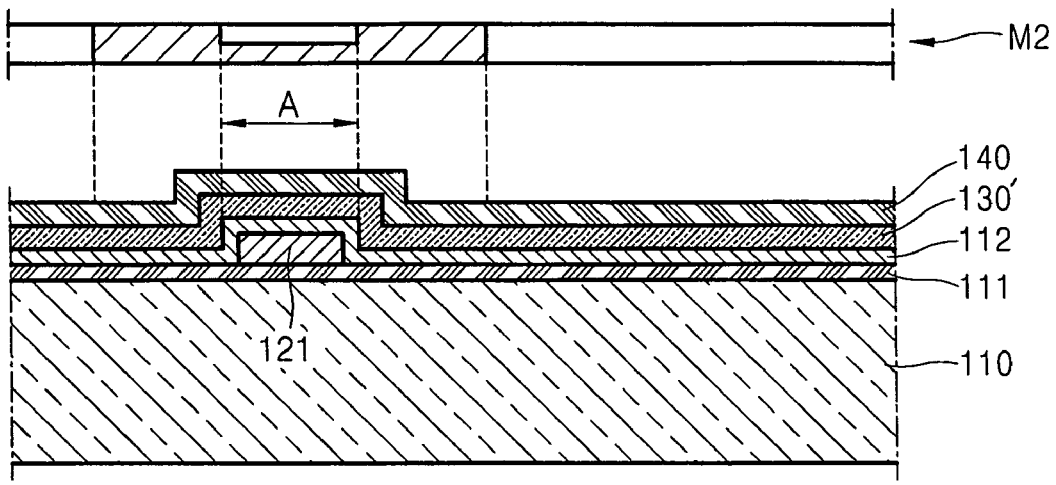
Figure 8:
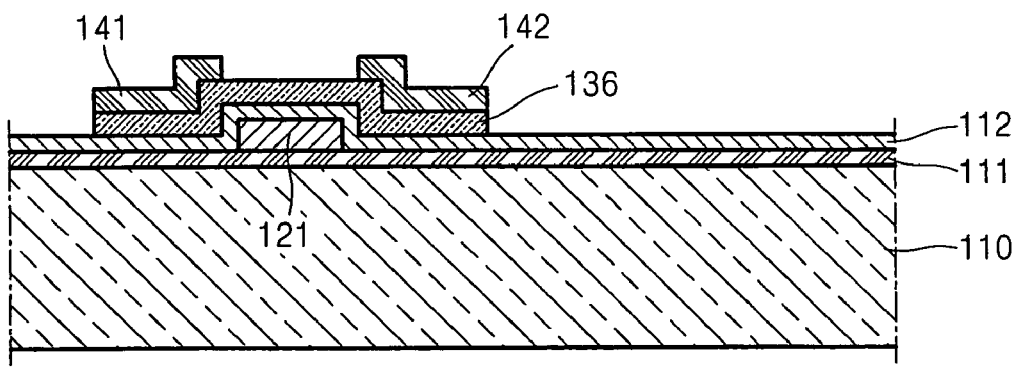

Next, as illustrated in FIG. 7, a conductive layer 140 may be formed, e.g., deposited, on the polycrystalline silicon layer 130'. The conductive layer 140 may be a single metal layer, e.g., an aluminum (Al) layer or a copper (Cu) layer, or a multilayer metal including one or more of, e.g., molybdenum (Mo), tungsten (W), chromium (Cr), and/or platinum (Pt), on the Al layer or the Cu layer. The polycrystalline silicon layer 130' and the conductive layer 140 may be simultaneously patterned using a second mask M2 to form the semiconductor layer 136 and source and drain electrodes 141 and 142, respectively, as illustrated in FIG. 8.

The second mask M2 may be a half-tone mask having a light transmission part, a light blockage part, and a semi-transmission part. The semi-transmission part may be positioned to overlap with a center portion of the semiconductor layer 136, i.e., part A in FIG. 7, so that a portion of the conductive layer 140 may be removed to expose an upper surface of the semiconductor layer 136, thereby resulting in the source and drain electrodes 141 and 142 being formed from the conductive layer 140. A portion of part A of the semiconductor layer 136 overlapping the gate electrode 121 may be a channel area, as will be described with respect to FIG. 9.

End parts of the semiconductor layer 136 and the source and drain electrodes 141 and 142 may have the same pattern due to the half-tone mask M2, though the present invention is not limited thereto. For example, when the half-tone mask M2 is modified in shape, the semiconductor layer 136 and the source and drain electrodes 141 and 142 may have end parts having different patterns.

Figure 9:
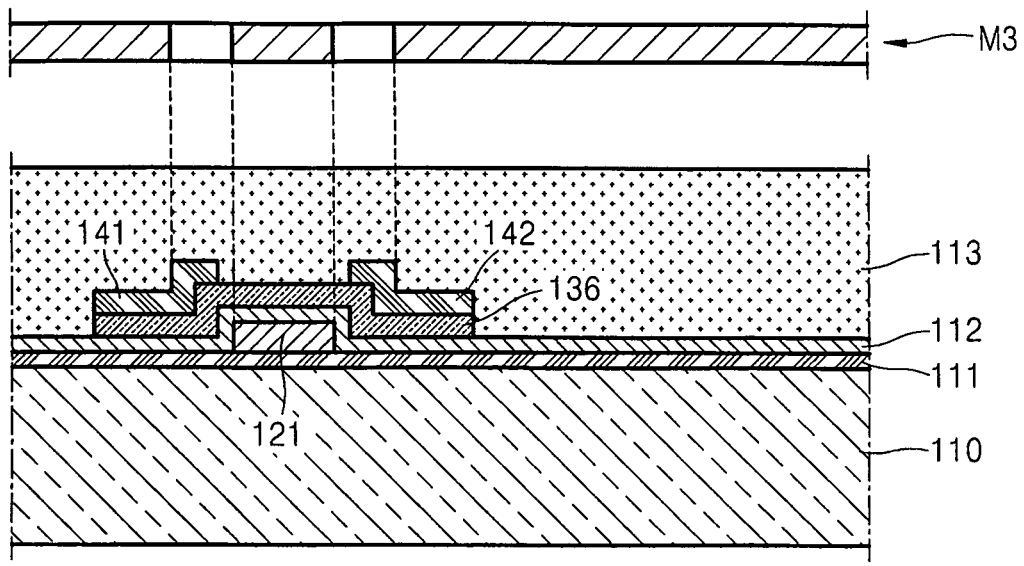

Referring to FIG. 9, a planarization layer 113 may be formed on the source and drain electrodes 141 and 142, on the exposed portion of the semiconductor layer 136 between the source and drain electrodes 141 and 142, and on the gate insulating layer 112. The planarization layer 113 may be at least one of an inorganic insulating layer and organic insulating layer. The inorganic insulating layer may include $SiO_2$, $SiN_x$, SiON, $Al_2O_3$, $TiO_2$, $Ta_2O_5$, $HfO_2$, $ZrO_2$, BST, PZT, or the like. The organic insulating layer may include a commercially available polymer, such as PMMA or PS, a polymer derivative having a phenol group, an acryl-based polymer, an imide-based polymer, an arylether-based polymer, an amide-based polymer, a fluorine-based polymer, a p-xylene-based polymer, a vinylalcohol-based polymer, a blend thereof, or the like. In addition, the planarization layer 113 may be a composite deposition layer including an inorganic insulating layer and an organic insulating layer.

Figure 10:
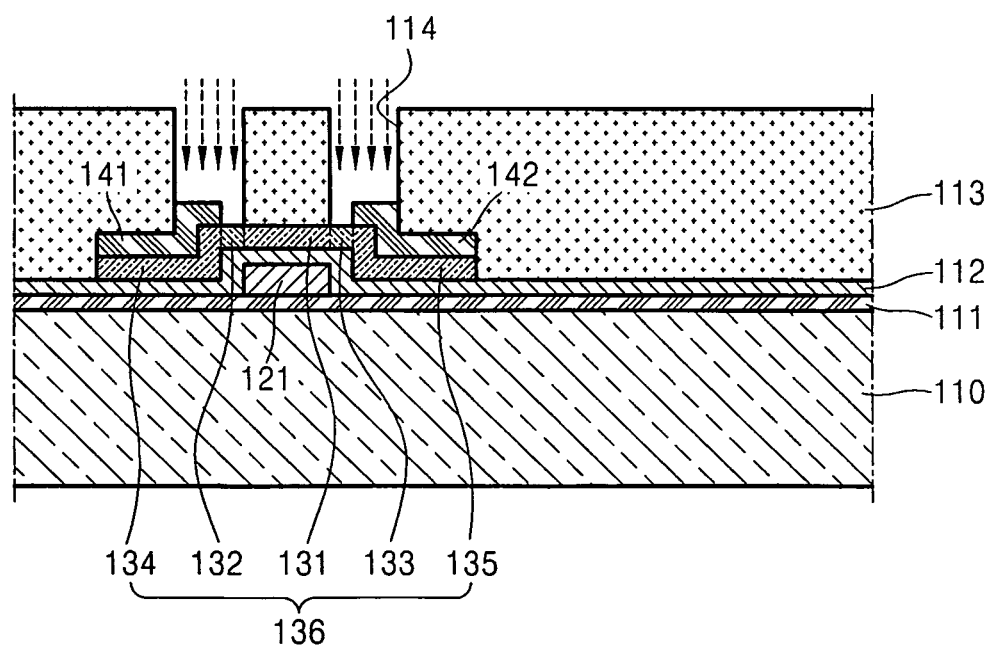

After the planarization layer 113 is formed, a mask M3 may be used to expose a portion of exposed part A of the semiconductor layer 136 and portions of the source and drain electrodes 141 and 142. Referring to FIG. 10, a part of the planarization layer 113 corresponding to the gate electrode 121 may be kept, i.e., is not etched. The exposed portion of part A of the semiconductor layer 136, which corresponds to the gate electrode 121, may be used for forming the channel area 131. In addition, the planarization layer 113 surrounding end parts of the gate insulating layer 112 and the source and drain electrodes 141 and 142 are not etched. The non-etched portions of the planarization layer 113 may be used as masks while doping the semiconductor layer 136 with an impurity.

The semiconductor layer 136 may be doped with an impurity in a self-aligned manner by using the patterned planarization layer 113, without having to use an additional mask.

Doping the semiconductor layer 136 with the impurity by using the planarization layer 113 will now be described in detail. According to the application of the thin film transistor, the semiconductor layer 136 may be doped with an N-type or P-type impurity by, for example, ion implantation. N-type doping may be performed using ionized $PH_3$ gas, and P-type doping may be performed using ionized $B_2H_6$ gas. In the current exemplary embodiment, the non-etched part of the planarization layer 113 may act as an alignment mask, so that doping ions may be injected only through an opening 114 in the planarization layer 113, the opening 114 having been formed by etching the planarization layer 113. Some of the doping ions injected through the opening 114 may reach the source and drain electrodes 141 and 142, and some others of the doping ions may reach the semiconductor layer 136 formed of the polycrystalline silicon. Parts of the semiconductor layer 136 exposed in the openings 114 by the configurations of the source and drain electrodes 141 and 142 may be doped with an impurity, resulting in first source and drain areas 132 and 133 of the semiconductor layer 136.

As described above, the semiconductor layer 136 and the source and drain electrodes 141 and 142 may be simultaneously patterned, the semiconductor layer 136 may be doped with ions without requiring the use of an additional mask, and a need to form a contact hole to electrically connect first source and drain areas 132 and 133 to the source and drain electrodes 141 and 142 may be avoided, so that mask patterning processes may be significantly simplified.

It is possible that the contact area between the first source and drain areas 132 and 133 and the source and drain electrodes 141 and 142 may be small such that the contact resistance between the first source and drain areas 132 and 133 and the source and drain electrodes 141 and 142 may be high, which could deteriorate the operating characteristics of the thin film transistor. In order to reduce such contact resistance, the thin film transistor according to the current exemplary embodiment of the present invention may be subjected to a heating process. The heating process may be, e.g., a furnace method, a rapid thermal annealing (RTA) method in which a substrate may be rapidly heated using radiation of a tungsten halogen lamp, a laser method, etc.

When a thin film transistor is heated using one or more of the methods described above and metals forming the source and drain electrodes 141 and 142 reach a melting critical point, these metals may be diffused into second source and drain areas 134 and 135 outside the first source and drain areas 132 and 133 of the semiconductor layer 136, i.e., in areas corresponding to the source and drain electrodes 141 and 142. For example, when source and drain electrodes 141 and 142 formed of Al are heated in a furnace to about 300° C., which is equal to or higher than the melting point of Al, for about 2 hours, the Al may become diffused into the second source and drain areas 134 and 135, so that the second source and drain areas 134 and 135 have a metallic property similar to the source and drain electrodes 141 and 142.

As described above, the source and drain electrodes 141 and 142 may include a single metal, e.g., Al, or two or more kinds of metals. The heating temperature used to heat the substrate should be higher than the lowest melting point of the source and drain electrode metals.

In a thin film transistor according to the current exemplary embodiment of the present invention, the contact area between the source and drain electrodes 141 and 142 and the impurity-doped first source and drain areas 132 and 133 may be relatively narrow, but this may be offset by a decreased contact resistance between the source and drain electrodes 141 and 142 and the impurity-doped first source and drain areas 132 and 133. The decreased contact resistance may be achieved by the second source and drain areas 134 and 135 acting as passages through which current may flow between the source and drain electrodes 141 and 142 and the impurity-doped first source and drain areas 132 and 133.

During the heating process, heat may be directly provided to portions of the source and drain electrodes 141 and 142 exposed by the opening 114. Accordingly, there is no need to perform a separate patterning process to expose the source and drain electrodes 141 and 142 to heat. Thus, the opening 114 of the planarization layer 113 may act as an alignment mask for ion doping, may expose the source and drain electrodes 141 and 142 to heat and may act as a via hole for connecting a pixel electrode 151 (described below). In other words, according to the current exemplary embodiment of the present invention, the via hole forming process and heating process may be performed using a pattern which is formed using a single mask M3, so that the heating process may be performed without use of additional mask processes.

Figure 11:
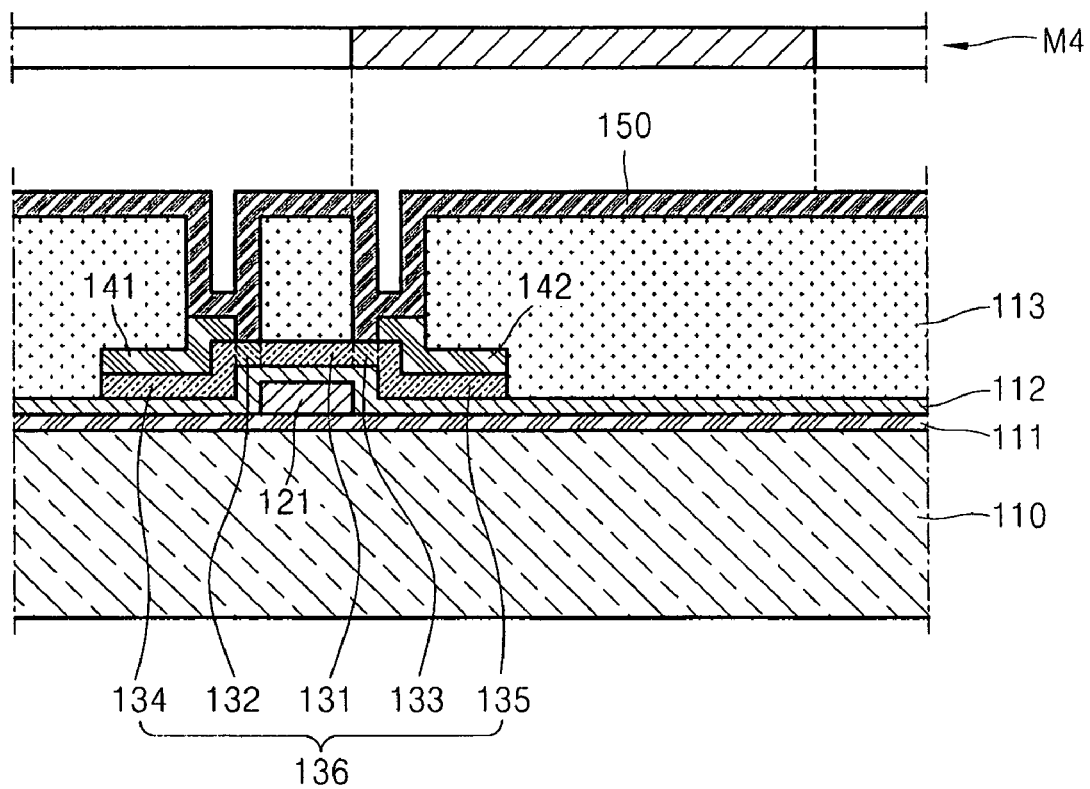

Referring to FIG. 11, a conductive material 150 may be formed, e.g., deposited, on the entire surface of the structure illustrated in FIG. 9. A mask M4 may then be used to pattern the conductive material 150 so that the conductive material 150 may remain on a part of the first drain area 133, a part of the drain electrode 142, and a part of the planarization layer 113. Alternatively, the pixel electrode 151 formed by patterning the conductive material 150 may also be patterned to contact the first source area 132 and the source electrode 141.

As a result of the patterning with the mask M4, the thin film transistor illustrated in FIG. 1 may be formed. It will be appreciated that the structure is not limited to the structure illustrated in FIG. 1, and may vary according to manufacturing conditions, such as a mask work tolerance or the thickness of the conductive material 150. Further, the pixel electrode 151 may contact only the drain electrode 142 and not the first drain area 133, or may be further formed on a part of the planarization layer 113 corresponding to the gate electrode 121. The pixel electrode 151 should not act as a short-circuit between (1) the source electrode 141 and/or the first source area 132 and (2) the drain electrode 142 and/or the first drain area 133.

As described above, in the method of manufacturing the thin film transistor substrate according to the current exemplary embodiment of the present invention, the mask patterning processes may be significantly simplified. In addition, a metal may be diffused in the second source and drain areas 134 and 135 without use of additional mask processes, so that contact resistance between the source and drain electrodes 141 and 142 and the first source and drain areas 132 and 133 may be reduced.

Referring to FIGS. 1 and 11, an organic light emitting display device according to an exemplary embodiment of the present invention will now be described in detail. Since the organic light emitting display device according to the current exemplary embodiment may include a bottom gate-type thin film transistor, a detailed description of the bottom gate-type thin film transistor will not be repeated. The same reference numbers refer to the same elements.

Referring to FIG. 1, the organic light emitting display device according to the current exemplary embodiment of the present invention may include a substrate 110, and a buffer layer 111, a gate electrode 121, a gate insulating layer 112, a semiconductor layer 136, source and drain electrodes 141 and 142, a planarization layer 113, a pixel electrode 151, a pixel defining layer 160, an organic emission layer 180, and an opposite electrode 190 formed on the substrate 110.

The process of forming the gate electrode 121, the semiconductor layer 136, the source and drain electrodes 141 and 142, and the planarization layer 113 on the substrate 110 may be as described above regarding the previous exemplary embodiment. When the organic light emitting display device is a top emission type display device in which an image is viewed from the top of the device, a material which forms the substrate 110 would not be limited to a transparent material.

In the organic light emitting display device according to the current exemplary embodiment, the pixel electrode 151 may act as an anode of the organic light emitting display device, and the opposite electrode 190 may act as the cathode. Alternatively, the pixel electrode 151 may act as a cathode and the opposite electrode 190 may act as the anode.

When the organic light emitting display device is a bottom emission type organic light emitting display device in which an image is viewed from below the substrate 110, the pixel electrode 151 may be a transparent electrode and the opposite electrode 190 may be a reflective electrode. In such circumstances, the pixel electrode 151 may be formed of a material having a high work function, such as ITO, IZO, ZnO, or $In_2O_3$, and the opposite electrode 190 may be formed of a material having a low work function, such as Ag, Mg, Al, Pt, Pd, Au, Ni, Nd, Ir, Cr, Li, or Ca.

When the organic light emitting display device according to the current exemplary embodiment is a top emission type organic light emitting display device in which an image is projected toward the opposite electrode 190, the pixel electrode 151 may be a reflective electrode, and the opposite electrode 190 may be a transparent electrode. In such circumstances, the reflective pixel electrode 151 may be a reflective layer formed using Ag, Mg, Al, Pt, Pd, Au, Ni, Nd, Ir, Cr, Li, Ca, or a mixture thereof, and then forming, e.g., depositing, a material having a high work function, such as ITO, IZO, ZnO, or $In_2O_3$ thereon. The transparent electrode opposite electrode 190 may be formed by depositing a metal having a low work function, such as Ag, Mg, Al, Pt, Pd, Au, Ni, Nd, Ir, Cr, Li, Ca, or a mixture thereof, and then forming an assistant electrode layer or bus electrode line thereon using a transparent conductive material, such as ITO, IZO, ZnO, or $In_2O_3$.

In addition, a surface contact force between the pixel electrode 151 and the planarization layer 113 may be improved by forming the pixel electrode 151 using, e.g., ITO, IZO, ZnO, or $In_2O_3$, forming, e.g., depositing, a metal having a low work function, such as Ag, Mg, Al, Pt, Pd, Au, Ni, Nd, Ir, Cr, Li, Ca, or a mixture thereof on the pixel electrode 151, and then forming, e.g., depositing, a material having a high work function, such as ITO, IZO, ZnO, or $In_2O_3$ thereon.

Figure 12:
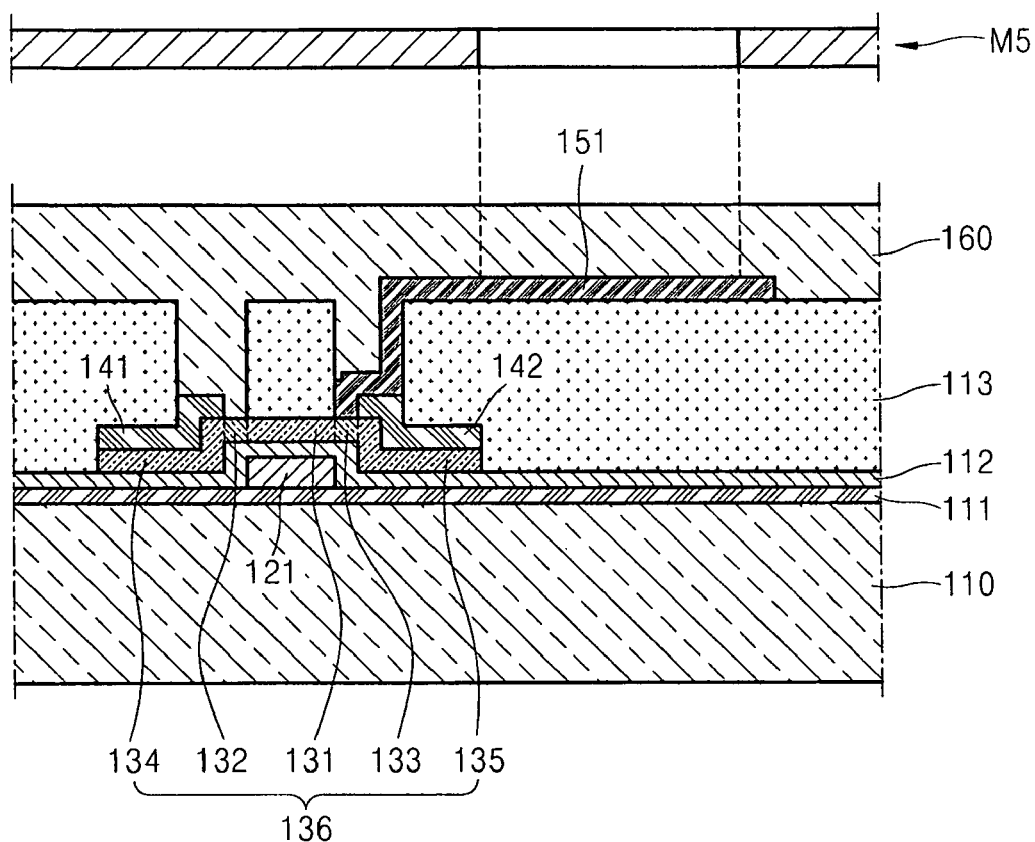
FIG. 12 illustrates a schematic, cross-sectional view of the organic light emitting display device of FIG. 2 during a method of manufacturing thereof according to an exemplary embodiment of the present invention.

Referring to FIG. 12, a material for forming a pixel defining layer 160 may be formed, e.g., deposited, on the structure illustrated in FIG. 1 described above. In the current exemplary embodiment, the pixel defining layer 160 may be formed of polyimide. The pixel defining layer 160 may define an emission area. The pixel defining layer 160 also may serve as a spacer to widen an interval between an end part of the pixel electrode 151 and the opposite electrode 190 thereby to reduce or prevent formation of a field enhancement phenomenon in the end part of the pixel electrode 151 so that instances of a short circuit between the pixel electrode 151, and the opposite electrode 190 may be reduced or prevented.

After the pixel defining layer 160 is patterned using a mask M5, the organic emission layer 180 may be formed on the resultant structure. The organic emission layer 180 may emit light according to an electrical operation of the pixel electrode 151 and the opposite electrode 190. The opposite electrode 190 may be used as a common electrode and may be formed, e.g., deposited, on the organic emission layer 180. A sealing member (not shown), that may protect the organic emission layer 180 from external moisture or oxygen, may be further formed on the opposite electrode 190.

The organic emission layer 180 may be formed of a low molecular weight organic material or a polymer organic material. When the organic emission layer 180 is formed of a low molecular weight organic material, a hole transport layer, a hole injection layer, and the like may be sequentially formed on the organic emission layer 180 in a direction toward the pixel electrode 151. Also, an electron transport layer, an electron injection layer, and the like may be sequentially formed, e.g., deposited, on the organic emission layer 180 in a direction toward the opposite electrode 190. If required, other layers may be further formed. A usable organic material may be copper phthalocyanine (CuPc), N,N'-dinaphthalene-1-yl-N,N'-diphenyl-benzidine (NPB), or tris-8-hydroxyquinoline aluminum (Alq3).

When the organic emission layer 180 is a polymer organic layer formed of a polymer organic material, a hole transport layer (HTL) alone may be formed on the organic emission layer 180 in a direction toward the pixel electrode 151. The hole transport layer may be formed on a pixel electrode 151 and may be formed of poly-2,4-ethylene-dihydroxy thiophene (PEDOT), polyaniline (PANI), or the like through ink-jet printing or spin coating. The organic emission layer 180 may be formed of PPV, soluble PPV's, cyano-PPV, polyfluorene, or the like, and may be formed by ink-jet printing, spin coating, or thermal transference using a laser, to have a color pattern.

In an organic light emitting display device according to the current exemplary embodiment, at least two increases in efficiency may be achieved. First, the semiconductor layer 136 and the source and drain electrodes 141 and 142 may be simultaneously patterned. Second, the semiconductor layer 136 may be doped with ions using as a mask the planarization layer 113 having the opening 114 formed therein as a via hole for connecting the drain electrode 142 to the pixel electrode 151. As a result of efficiency increases, the number of mask processes may be significantly reduced. In addition, by the heating process, a metal may be diffused in the second source and drain areas 134 and 135 so that increased contact resistance, between the source and drain electrodes 141 and 142 and the first source and drain areas 132 and 133, that otherwise could arise a small contact area between the source and drain electrodes 141 and 142 and the first source and drain areas 132 and 133, may be avoided.

Figure 3:
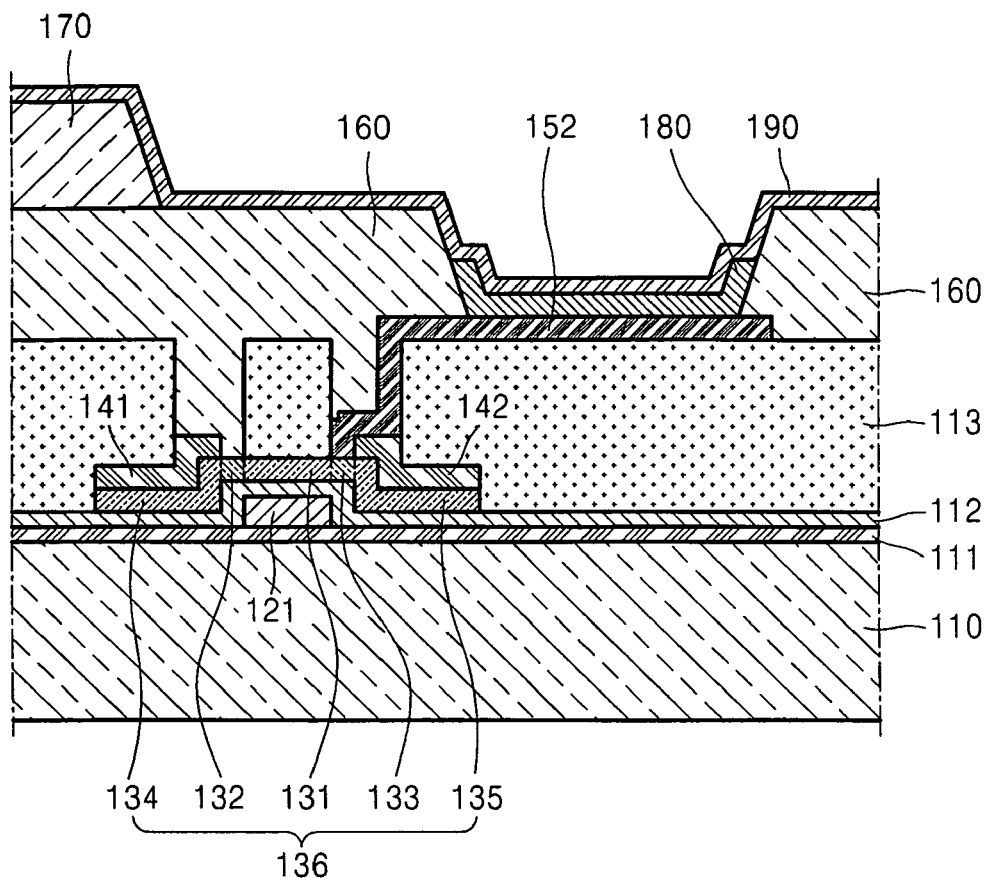
FIG. 3 illustrates a schematic, cross-sectional view of an organic light emitting display device according to another exemplary embodiment of the present invention.

Referring to FIG. 3, the organic light emitting display device according to the current exemplary embodiment may further include a spacer 170 on the pixel defining layer 160 of the organic light emitting display device according to the previous exemplary embodiment. An organic emission layer 180 may be formed on the pixel electrode 152 and an opposite electrode 190 may be formed on the spacer 170.

Figure 13:
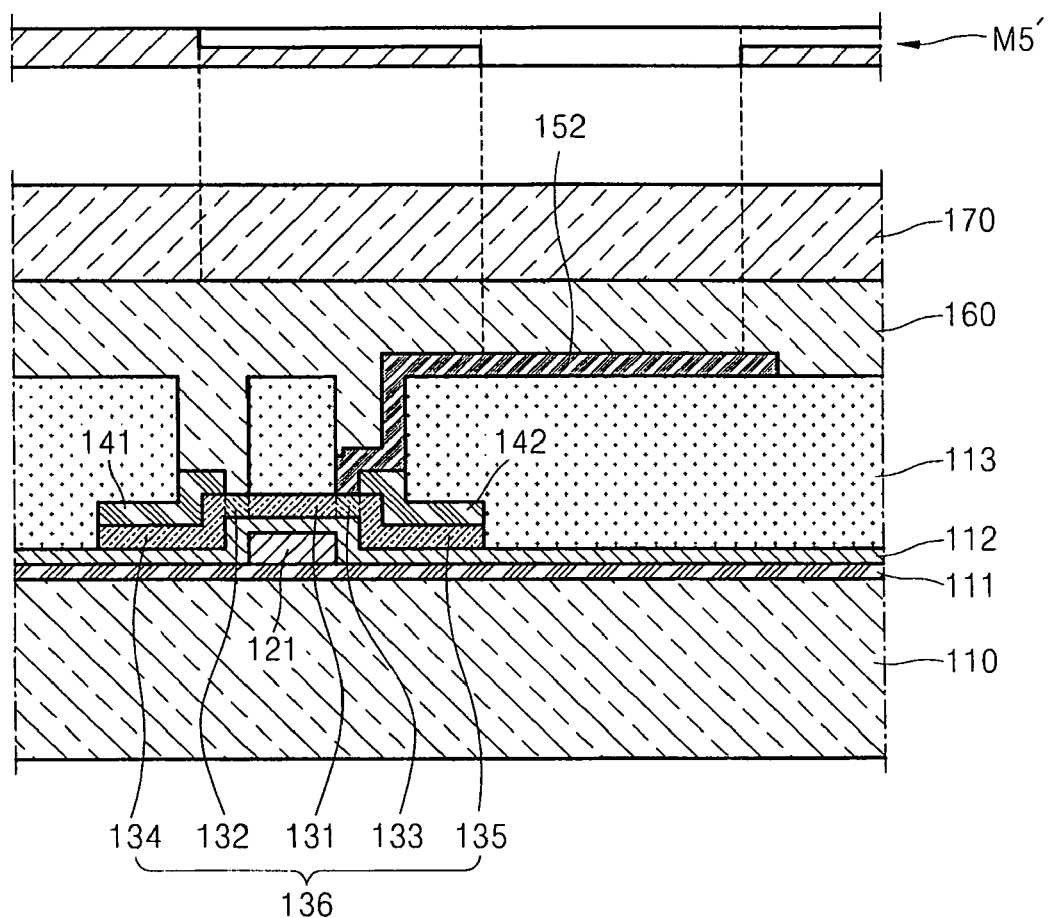
FIG. 13 illustrates a schematic, cross-sectional view of the organic light emitting display device of FIG. 3 during a method of manufacturing thereof according to an exemplary embodiment of the present invention.

Referring to FIG. 13, a layer of material for forming the pixel defining layer 160 and a layer of material for forming the spacer 170 may be sequentially formed, e.g., deposited, on the structure illustrated in FIG. 1. In the current exemplary embodiment, both the pixel defining layer 160 and the spacer 170 may be formed of polyimide. The spacer 170 may protect the organic emission layer 180 from external impacts.

Before the pixel defining layer 160 is patterned, the layer of material for forming the spacer 170 may be deposited on the pixel defining layer 160, and then the pixel defining layer 160 and the spacer 170 may be simultaneously patterned using a mask M5'. When the pixel defining layer 160 and the spacer 170 have the same pattern, the mask M5' may be a general mask including only a light transmission part and a light blockage part. However, when the pixel defining layer 160 and the spacer 170 have a different pattern from each other, the mask M5' may be a half-tone mask that may further include a semi-transmission part as illustrated in FIG. 13.

After the pixel defining layer 160 and the spacer 170 are patterned using the mask M5', the organic emission layer 180 and the opposite electrode 190 may be formed on the resultant structure. In some cases, a sealing member (not shown) may be further formed on the opposite electrode 190 to protect the emission layer 180 from external moisture or oxygen.

In the organic light emitting display device according to the current exemplary embodiment, the semiconductor layer 136 and the source and drain electrodes 141 and 142 may be simultaneously patterned, and the pixel defining layer 160 and the spacer 170 may be simultaneously patterned. As a result, the number of mask patterning processes may be significantly reduced. In addition, increased contact resistance between the source and drain electrodes 141 and 142 and the first source and drain areas 132 and 133, that otherwise could arise from a small contact area between the source and drain electrodes 141 and 142 and the first source and drain areas 132 and 133, may be avoided by dispersing a metal into the second source and drain areas 134 and 135, as described above.

Although an organic light emitting display device is described according to an exemplary embodiment of the present invention, the thin film transistor according to an embodiment of the present invention may also be used in various other display devices, such as a liquid crystal display device. Such variation can be sufficiently understood by those of ordinary skill in the art.

As described above, embodiments of the present invention may have one or more of the following advantages. First, a semiconductor layer and source and drain electrodes may be simultaneously patterned so that the number of mask processes may be reduced. Second, a pixel defining layer and a spacer may be simultaneously patterned, also thereby reducing the number of mask processes. Third, the semiconductor layer may be doped with ions without having to use an additional masking process by making expanded use of a mask process which may be performed to connect a pixel electrode to a source/drain electrode. Fourth, an increase in contact resistance, that otherwise could be due to a small contact area between a source/drain electrode and a doped area of the semiconductor layer, may be reduced or prevented by dispersing a metal of the source/drain electrode in the semiconductor layer.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:
1. A thin film transistor, comprising:
a substrate;
a gate electrode disposed on the substrate;
a gate insulating layer disposed on the gate electrode and the substrate;
a semiconductor layer, disposed on the gate insulating layer, including at least the following:

a channel area corresponding to the gate electrode,
first source and drain areas doped with an impurity outside the channel area, and
second source and drain areas, including a metal, outside the first source and drain areas;
source and drain electrodes overlapping substantially an entire length of the second source and drain areas and exposing the first source and drain areas, end parts of the source and drain electrodes being vertically aligned with end parts of the semiconductor layer;
a planarization layer disposed on the gate insulating layer, the source and drain electrodes, and the channel area, and the planarization layer having openings exposing parts of the first source and drain areas and the source and drain electrodes; and
a pixel electrode disposed on the planarization layer and electrically connected to at least one of the source and drain electrodes through one of the openings, the pixel electrode being in direct contact with the parts of the first source and drain areas exposed through one of the openings in the planarization layer.

2. The thin film transistor as claimed in claim 1, wherein the metal included in the second source and drain areas includes a metal forming the source and drain electrodes.

3. The thin film transistor as claimed in claim 2, wherein the metal forming the source and drain electrodes includes at least one of Al, Cu, Mo, W, Cr, and Pt.

4. The thin film transistor as claimed in claim 1, wherein the semiconductor layer includes polycrystalline silicon.

5. The thin film transistor as claimed in claim 1, further comprising a buffer layer disposed on the substrate.

6. An organic light emitting display device, comprising:
a substrate;
a gate electrode disposed on the substrate;
a gate insulating layer disposed on the gate electrode and the substrate;
a semiconductor layer, disposed on the gate insulating layer, including at least the following:
a channel area corresponding to the gate electrode,
first source and drain areas doped with an impurity outside the channel area, and
second source and drain areas, including a metal, outside the first source and drain areas;
source and drain electrodes overlapping substantially an entire length of the second source and drain areas and exposing the first source and drain areas, end parts of the source and drain electrodes being vertically aligned with end parts of the semiconductor layer;
a planarization layer disposed on the gate insulating layer, the source and drain electrodes, and the channel area, and the planarization layer having openings exposing parts of the first source and drain areas and the source and drain electrodes;
a pixel electrode disposed on the planarization layer and electrically connected to at least one of the source and drain electrodes through one of the openings, the pixel electrode being in direct contact with the parts of the first source and drain areas exposed through one of the openings in the planarization layer;
a pixel defining layer disposed on the planarization layer and the pixel electrode and exposing a part of the pixel electrode;
an organic emission layer disposed on the exposed pixel electrode; and
an opposite electrode disposed on the organic emission layer.

7. The organic light emitting display device as claimed in claim 6, further comprising a spacer disposed on the pixel defining layer.

8. The organic light emitting display device as claimed in claim 7, wherein the pixel defining layer and the spacer are formed of the same material.

9. A method of manufacturing a thin film transistor, the method comprising:
providing a starting structure including a substrate and a gate electrode disposed on the substrate, a gate insulating layer disposed on the gate electrode and the substrate, and a semiconductor layer disposed on the gate insulating layer;
simultaneously patterning the semiconductor layer and the conductive layer and forming source and drain electrodes, a channel area corresponding to the gate electrode, first source and drain areas outside the channel areas, and second source and drain areas outside the first source and drain areas, wherein end parts of the source and drain electrodes are vertically aligned with end parts of the semiconductor layer, and the source and drain electrodes overlap substantially an entire length of the second source and drain areas;
forming a planarization layer on the gate insulating layer, the source and drain electrodes, and the channel area;
forming openings in the planarization layer to expose parts of the first source and drain areas and of the source and drain electrodes;
doping the first source and drain areas with an impurity; and
dispersing a metal of the source and drain electrodes into at least the second source and drain areas of the semiconductor layer; and
disposing a pixel electrode on the planarization layer;
the pixel electrode being electrically connected to at least one the source and drain electrodes through one of the openings in the planarization layer, the pixel electrode being in direct contact with the parts of the first source and drain areas exposed through one of the openings in the planarization layer.

10. The method as claimed in claim 9, wherein, in the dispersing of the metal into the second source and drain areas by heat treating, a temperature of the heat treating is equal to or higher than a melting point of the conductive layer.

11. The method as claimed in claim 9, further comprising:
forming the pixel electrode in one of the source and drain electrodes in one of the openings;
forming a pixel defining layer on the pixel electrode;
patterning the pixel defining layer to expose a part of the pixel electrode; and
forming an organic emission layer and an opposite electrode on the pixel defining layer.

12. The method as claimed in claim 11, further comprising forming a spacer on the pixel defining layer.

13. The method as claimed in claim 12, wherein the pixel defining layer and the spacer are simultaneously patterned using a half-tone mask.

14. The method as claimed in claim 12, wherein the pixel defining layer and the spacer are formed of the same material.

15. The method as claimed in claim 9, further comprising forming a buffer layer on the substrate.

16. The method as claimed in claim 9, wherein forming the semiconductor layer includes:
depositing an amorphous silicon layer on the gate electrode and on the gate insulating layer; and
crystallizing the amorphous silicon layer to form a polycrystalline silicon layer as the semiconductor layer.

17. The method as claimed in claim 9, wherein simultaneously patterning the semiconductor layer and the conductive layer includes using a half-tone mask.

* * * * *